United States Patent
Lin et al.

(10) Patent No.: US 12,132,003 B2
(45) Date of Patent: Oct. 29, 2024

(54) ELECTRONIC PACKAGE AND MANUFACTURING METHOD THEREOF

(71) Applicant: SILICONWARE PRECISION INDUSTRIES CO., LTD., Taichung (TW)

(72) Inventors: You-Chen Lin, Taichung (TW); Yu-Min Lo, Taichung (TW); Kuo-Hua Yu, Taichung (TW); Jun-Hao Feng, Taichung (TW)

(73) Assignee: SILICONWARE PRECISION INDUSTRIES CO., LTD., Taichung (TW)

( * ) Notice: Subject to any disclaimer, the term of this patent is extended or adjusted under 35 U.S.C. 154(b) by 358 days.

(21) Appl. No.: 17/568,913

(22) Filed: Jan. 5, 2022

(65) Prior Publication Data

US 2023/0136541 A1 May 4, 2023

(30) Foreign Application Priority Data

Oct. 29, 2021 (TW) .................................. 110140357

(51) Int. Cl.
*H01L 23/538* (2006.01)
*H01L 21/48* (2006.01)
*H01L 23/48* (2006.01)
*H01L 25/065* (2023.01)

(52) U.S. Cl.
CPC ...... *H01L 23/5383* (2013.01); *H01L 21/4857* (2013.01); *H01L 21/486* (2013.01); *H01L 23/5381* (2013.01); *H01L 23/481* (2013.01); *H01L 25/0655* (2013.01)

(58) Field of Classification Search
CPC ............. H01L 23/5383; H01L 21/4857; H01L 21/486; H01L 23/5381; H01L 23/481; H01L 25/0655; H01L 24/13; H01L 23/49816; H01L 23/5384; H01L 24/16; H01L 24/81; H01L 23/5385; H01L 25/16; H01L 25/18; H01L 2224/16225; H01L 2224/32225; H01L 2224/73204; H01L 2924/181; H01L 2924/18161; H01L 21/76805; H01L 23/31; H01L 21/568
See application file for complete search history.

(56) References Cited

U.S. PATENT DOCUMENTS

| | | | | |
|---|---|---|---|---|
| 2010/0314757 | A1* | 12/2010 | Sugiyama | H01L 25/105 257/737 |
| 2017/0040248 | A1* | 2/2017 | Chiang | H01L 24/19 |
| 2019/0019737 | A1* | 1/2019 | Hogyoku | H01L 23/15 |
| 2022/0392855 | A1* | 12/2022 | Darmawikarta | H01G 4/33 |

* cited by examiner

*Primary Examiner* — Evan G Clinton
(74) *Attorney, Agent, or Firm* — Studebaker & Brackett PC

(57) ABSTRACT

An electronic package is provided and includes a protection layer formed on the electronic structure having a plurality of conductors to cover the plurality of conductors, a dielectric layer having a plurality of grooves to enable the electronic structure to be bonded onto one side of the dielectric layer with the protection layer thereon such that each of the plurality of conductors is correspondingly accommodated in each of the plurality of grooves, and a plurality of conductive components disposed on another side of the dielectric layer. Accordingly, the design of the grooves is used to correspond to the high and low surfaces of the electronic structure such that the problem of poor manufacturing process can be avoided.

26 Claims, 10 Drawing Sheets

ELECTRONIC PACKAGE AND MANUFACTURING METHOD THEREOF

BACKGROUND

1. Technical Field

The present disclosure relates to a semiconductor device, and more particularly, to an electronic package with bridging components and a method for manufacturing the same.

2. Description of Related Art

With the vigorous development of the electronics industry, electronic products are gradually moving towards the trend of multi-function and high performance. Technologies currently applied in the field of chip packaging include, for example, flip-chip packaging modules, such as Chip Scale Package (CSP), Direct Chip Attached (DCA) or Multi-Chip Module (MCM), or chip stacking techniques involving stacking chips one on top of another to be integrated into a three-dimensional (3D) integrated circuit (IC).

FIG. 1 is a schematic cross-sectional view illustrating a conventional 3D chip stacking package structure 1. As shown in FIG. 1, the package structure 1 includes a through silicon interposer (TSI) 1a, which has a silicon substrate 10 and a plurality of conductive through-silicon vias (TSVs) 101 formed therein. In addition, a redistribution layer (RDL) electrically connected to the conductive TSVs 101 is formed on a surface of the silicon substrate 10. The redistribution layer includes a dielectric layer 11 and a circuit layer 12 formed on the dielectric layer 11, and the circuit layer 12 is electrically connected to the conductive TSVs 101. Additionally, an insulating protection layer 13 is formed on the dielectric layer 11 and the circuit layer 12, and exposes a portion of the circuit layer 12 such that the circuit layer 12 is bonded to a plurality of first conductive components 14 such as solder bumps.

Moreover, another insulating protection layer 15 can be formed on the silicon substrate 10, and the insulating protection layer 15 exposes end surfaces of the conductive TSVs 101 such that a plurality of second conductive components 16 are bonded onto the end surfaces of the conductive TSVs 101, and the second conductive components 16 are electrically connected to the conductive TSVs 101. Besides, the second conductive components 16 contain solder materials or copper bumps, and an under bump metallurgy (UBM) 160 connected to the second conductive components 16 may be selectively formed on the end surfaces of the conductive TSVs 101.

Additionally, the package structure 1 further includes a package substrate 19, on which the TSI 1a is disposed via the second conductive components 16 such that the package substrate 19 is electrically connected to the conductive TSVs 101, and the second conductive components 16 are covered with an underfill 191.

In addition, the package structure 1 further includes a plurality of semiconductor chips 17, which are disposed on the first conductive components 14 such that the semiconductor chips 17 are electrically connected onto the circuit layer 12. Besides, the semiconductor chips 17 are bonded to the first conductive components 14 in a flip-chip manner, the first conductive components 14 are covered with an underfill 171, and the packaging material 18 is formed on the package substrate 19 such that the packaging material 18 encapsulates the semiconductor chips 17 and the TSI 1a.

In subsequent applications, the package structure 1 may be formed with a plurality of solder balls 192 on the lower side of the package substrate 19 such that the package structure 1 is bonded onto an electronic device (not shown) such as a circuit board.

However, the cost of the TSI 1a is high. In addition, due to the mismatch of the coefficient of thermal expansion (CTE) among the underfill 171, the packaging material 18, the packaging substrate 19, the TSI 1a and the semiconductor chips 17, thermal stress is prone to unevenness. As a result of the thermal cycle, the TSI 1a has a great warpage, which may lead to reliability problems such as poor ball placement (for example, the second conductive components 16 is electrically disconnected with the TSI 1a).

Therefore, there is a need for a solution that addresses the above-mentioned issues of the prior art.

SUMMARY

In view of the various above-mentioned shortcomings of the prior art, the present disclosure provides an electronic package, which comprises: an electronic structure having a plurality of conductors; a protection layer formed on the electronic structure to cover the plurality of conductors; a dielectric layer having a plurality of grooves to enable the electronic structure to be bonded onto one side of the dielectric layer with the protection layer thereon, wherein the protection layer is disposed in the plurality of grooves, and each of the plurality of conductors is correspondingly accommodated in each of the plurality of grooves; and a plurality of conductive components disposed on another side of the dielectric layer and electrically connected to the plurality of conductors.

In the aforementioned electronic package, the plurality of grooves are free from penetrating through the dielectric layer. For example, a plurality of holes are formed on the another side of the dielectric layer and communicating with the plurality of grooves, wherein the plurality of conductors are exposed from the plurality of holes, respectively, and the plurality of conductive components are further formed in the plurality of holes, respectively, to electrically connect with the plurality of conductors.

In the aforementioned electronic package, each of the plurality of grooves has a width greater than a width of each of the plurality of holes.

In the aforementioned electronic package, the protection layer is a non-conductive film.

In the aforementioned electronic package, the protection layer is further formed between the plurality of conductors and a bottom surface of the plurality of grooves.

In the aforementioned electronic package, the plurality of grooves penetrate through the dielectric layer.

In the aforementioned electronic package, the plurality of conductors have a bottom surface flush with the another side of the dielectric layer.

The aforementioned electronic package further includes a wiring structure disposed on the another side of the dielectric layer and electrically connected to the plurality of conductors and the plurality of conductive components, wherein the wiring structure is disposed between the dielectric layer and the plurality of conductive components.

The aforementioned electronic package further includes an encapsulation layer covering the electronic structure. The aforementioned electronic package also includes a circuit structure formed on the encapsulation layer and electrically connected to the electronic structure, and at least two electronic components disposed on the circuit structure and electrically connected to the circuit structure. For example, the electronic structure is a bridging component electrically connected to the at least two electronic components, and a plurality of conductive vias electrically connected to the plurality of conductors and the circuit structure are disposed in the electronic structure, such that the plurality of conductive vias are electrically connected to the circuit structure and the electronic components. Additionally, the aforementioned electronic package may further include a plurality of conductive pillars disposed on the side of the dielectric layer as with the electronic structure, wherein the plurality of conductive pillars are electrically connected to the plurality of conductive components and the circuit structure.

The present disclosure further provides a method for manufacturing an electronic package, which comprises: providing an electronic structure including a plurality of conductors; forming a protection layer on the electronic structure to cover the plurality of conductors; providing a dielectric layer on a carrier, wherein the dielectric layer has a plurality of grooves; bonding the protection layer of the electronic structure onto one side of the dielectric layer, wherein the protection layer is disposed in the plurality of grooves, and each of the plurality of conductors is correspondingly accommodated in each of the plurality of grooves; removing the carrier, wherein the plurality of conductors are exposed from another side of the dielectric layer; and disposing a plurality of conductive components on the another side of the dielectric layer, wherein the plurality of conductive components are electrically connected to the plurality of conductors.

In the aforementioned method for manufacturing the electronic package, the plurality of grooves are free from penetrating through the dielectric layer, and after the carrier is removed, a plurality of holes connected to the plurality of grooves are formed on the another side of the dielectric layer, such that the plurality of conductors are exposed from the plurality of holes. For example, each of the plurality of grooves has a width greater than a width of each of the plurality of holes, such that each of the plurality of conductors abuts against a bottom surface of each of the plurality of grooves. Alternatively, the plurality of conductive components are further formed in the plurality of holes, respectively, to electrically connect with the plurality of conductors.

In the aforementioned method for manufacturing the electronic package, the protection layer is a non-conductive film.

In the aforementioned method for manufacturing the electronic package, the protection layer is further formed between the plurality of conductors and a bottom surface of the plurality of grooves.

In the aforementioned method for manufacturing the electronic package, the plurality of grooves penetrate through the dielectric layer.

In the aforementioned method for manufacturing the electronic package, the plurality of conductors have a bottom surface flush with the another side of the dielectric layer.

The aforementioned method for manufacturing the electronic package further includes disposing a wiring structure electrically connected to the plurality of conductors and the plurality of conductive components on the another side of the dielectric layer, wherein the wiring structure is disposed between the dielectric layer and the plurality of conductive components.

The aforementioned method for manufacturing the electronic package further includes covering the electronic structure with an encapsulation layer. The aforementioned method for manufacturing the electronic package also includes forming a circuit structure electrically connected to the electronic structure on the encapsulation layer, and disposing at least two electronic components electrically connected onto the circuit structure. For example, the electronic structure is a bridging component electrically connected to the at least two electronic components, and a plurality of conductive vias electrically connected to the plurality of conductors and the circuit structure are disposed in the electronic structure, such that the plurality of conductive vias are electrically connected to the electronic components and the plurality of conductive components. The aforementioned method for manufacturing the electronic package may further include disposing a plurality of conductive pillars on the side of the dielectric layer as with the electronic structure, wherein the plurality of conductive pillars are electrically connected to the plurality of conductive components and the circuit structure.

The aforementioned method for manufacturing the electronic package further includes simultaneously forming the plurality of grooves and a plurality of openings on the dielectric layer by exposure and development to form the plurality of conductive pillars from the plurality of openings, respectively. The aforementioned method for manufacturing the electronic package further includes forming a plurality of openings on the dielectric layer by exposure and development, and subsequently forming the plurality of grooves on the dielectric layer by exposure and development to form the plurality of conductive pillars from the plurality of openings, respectively.

In the aforementioned method for manufacturing the electronic package, a manufacturing process of the plurality of grooves includes: forming a first insulating material with an opening on the carrier; forming a second insulating material on the first insulating material; and forming a groove for exposing the first insulating material on the second insulating material and an another opening connecting with the opening, wherein the first insulating material and the second insulating material serve as the dielectric layer, and one of the conductive pillars is formed in the opening and the another opening.

As can be understood from the above, in the electronic package and method for manufacturing the same according to the present disclosure, the design of the grooves in the dielectric layer is mainly used to correspond to the high and low surfaces of the protection layer of the electronic structure such that voids are free from being generated after the electronic structure is bonded to the dielectric layer, thereby avoiding the problems of poor manufacturing process and poor reliability.

Furthermore, by accommodating the conductors of the electronic structure by the grooves, it is advantageous to locate the electronic structure, such that the electronic structure will be free from being deviated. As such, even if warpage occurs, the conductive components can be effectively electrically connected to the electronic structure to ensure the manufacturing process yield.

BRIEF DESCRIPTION OF DRAWINGS

FIGS. 2A-1, 2B-1, 2C, 2D, 2E, 2F, 2G-1 and 2H are schematic cross-sectional views illustrating a method for manufacturing an electronic package in accordance with a first embodiment of the present disclosure.

FIG. 2A-2 is a schematic partial enlarged cross-sectional view of FIG. 2A-1.

FIG. 2A-3 is a schematic partial cross-sectional view illustrating another method for manufacturing an electronic package of FIG. 2A-1.

FIG. 2B-2 is a schematic partial enlarged cross-sectional view of FIG. 2B-1.

FIG. 2B-3 is a schematic cross-sectional view of another aspect of FIG. 2B-2.

FIG. 2G-2 is a schematic partial enlarged cross-sectional view of FIG. 2G-1.

FIG. 2G-3 is a schematic partial cross-sectional view illustrating another method for manufacturing an electronic package of FIG. 2G-1.

FIGS. 3A, 3B-1 and 3C-1 are schematic cross-sectional views illustrating a method for manufacturing an electronic package in accordance with a second embodiment of the present disclosure.

FIG. 3B-2 is a schematic partial enlarged cross-sectional view of FIG. 3B-1.

FIG. 3B-3 is a schematic cross-sectional view of another aspect of FIG. 3B-2.

FIG. 3C-2 is a schematic partial enlarged cross-sectional view of another aspect of FIG. 3C-1.

DETAILED DESCRIPTION

Figure 1:
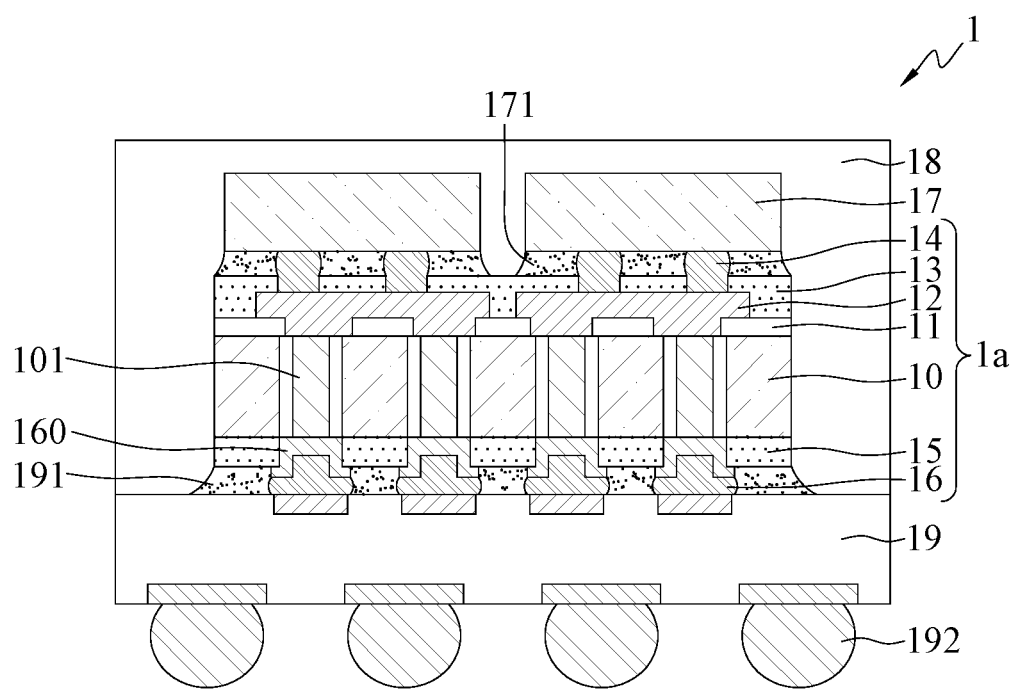
FIG. 1 is a schematic cross-sectional view of a conventional package structure.

Implementations of the present disclosure are illustrated using the following embodiments. One of ordinary skill in the art can readily appreciate other advantages and technical effects of the present disclosure upon reading the content of this specification.

It should be noted that the structures, ratios, sizes shown in the drawings appended to this specification are to be construed in conjunction with the disclosure of this specification in order to facilitate understanding of those skilled in the art. They are not meant, in any ways, to limit the implementations of the present disclosure, and therefore have no substantial technical meaning. Any modifications, changes or adjustments to the structures, ratio relationships or sizes, are to be construed as falling within the range covered by the technical content disclosed herein to the extent of not causing changes in the technical effects created and the objectives achieved by the present disclosure, Meanwhile, terms such as "above," "first," "second," "a," "an," and the like recited herein are for illustrative purposes, and are not meant to limit the scope in which the present disclosure can be implemented. Any variations or modifications to their relative relationships, without changes in the substantial technical content, should also be regarded as within the scope in which the present disclosure can be implemented.

FIGS. 2A-1, 2B-1, 2C, 2D, 2E, 2F, 2G-1 and 2H are schematic cross-sectional views illustrating a method for manufacturing an electronic package 2 in accordance with a first embodiment of the present disclosure.

Figures 1, 2A:
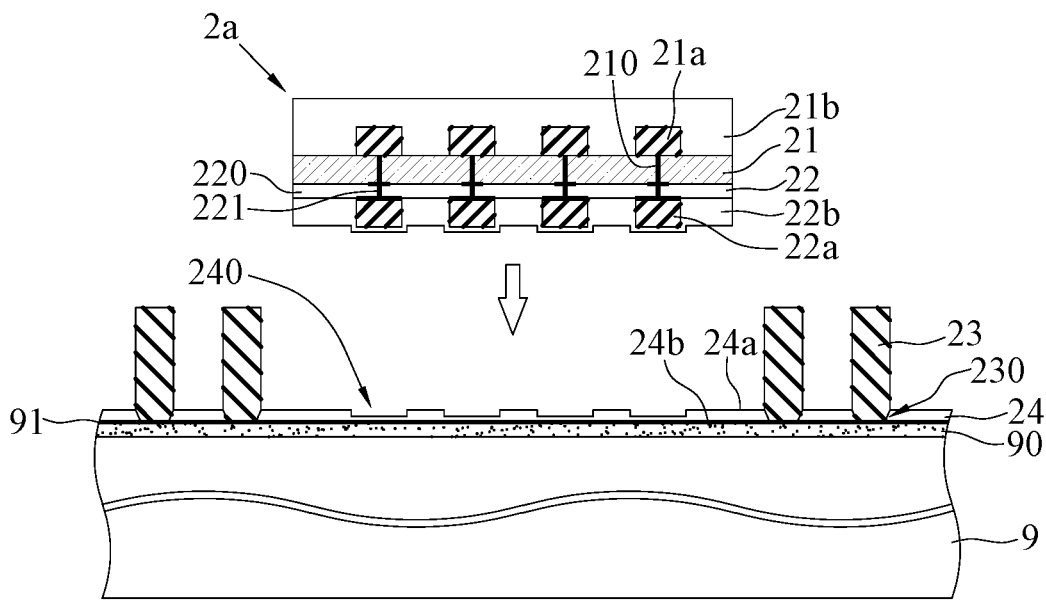

As shown in FIG. 2A-1, the present disclosure provides a carrier 9 on which a dielectric layer 24 is disposed, and the dielectric layer 24 has a plurality of grooves 240. Subsequently, a plurality of conductive pillars 23 are formed on the carrier 9. The dielectric layer 24 has a first side 24a and a second side 24b opposite to each other such that the grooves 240 are formed on the first side 24a, and the second side 24b of the dielectric layer 24 is bonded onto the carrier 9.

In an embodiment, the carrier 9 is, for example, a plate made of a semiconductor material (e.g., silicon or glass), on which a sacrificial release layer 90 and a metal layer 91 (e.g., titanium/copper) are sequentially formed by, for example, coating. Therefore, the dielectric layer 24 is formed on the metal layer 91. For example, the material forming the dielectric layer 24 is a dielectric material such as polybenzoxazole (PBO), polyimide (PI), prepreg (PP), or other materials.

Moreover, the material forming the conductive pillars 23 is a metal material such as copper or a solder material, and the conductive pillars 23 extend through the dielectric layer 24 to contact the metal layer 91. For example, through exposure and development, a plurality of openings 230 exposing the metal layer 91 are formed on the dielectric layer 24 such that the conductive pillars 23 are formed by electroplating from the openings 230 by the metal layer 91.

Figures 2, 2A:
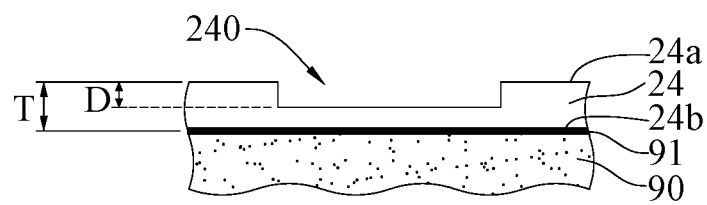

Further, each of the grooves 240 has a depth D that is 0.4 to 1 times a thickness T of the dielectric layer 24 such that the grooves 240 may be free from penetrating through the dielectric layer 24, as shown in FIG. 2A-2. For example, the grooves 240 are formed by exposure and development. Accordingly, the grooves 240 and the openings 230 may be made together (i.e., both are formed by a single exposure and development operation). It should be understood that if holes of different depths are to be made on a single insulating material with one exposure and development, the parameters are needed to be adjusted to make the holes at the center (e.g., the grooves 240) and the surrounding (e.g., the openings 230) have different depths. It should be understood that the grooves 240 and the openings 230 may also be made separately (that is, two exposure and development operations respectively form both the grooves 240 and the openings 230). For example, the openings 230 are formed by the first exposure and development, and then the grooves 240 are formed by the second exposure and development.

Figures 2, 2A, 3:
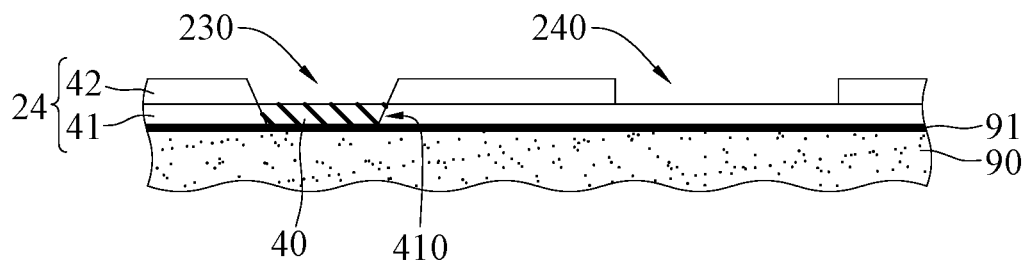

In addition, the manufacturing process of the groove 240 may also match the design of the conductive pillar 23, as shown in FIG. 2A-3. For example, a first insulating material 41 with an opening 410 is firstly formed on the metal layer 91, and then a metal block 40 is formed in the first insulating material 41 by electroplating the metal layer 91. Subsequently, a second insulating material 42 is formed on the first insulating material 41 and the metal block 40. After that, a groove 240 for exposing the first insulating material 41 and another opening 230 for communicating with the opening 410 (or exposing the metal block 40) are formed on the second insulating material 42 to make the first insulating material 41 and the second insulating material 42 serve as the dielectric layer 24. Besides, a metal pillar (not shown) is formed on the metal block 40 in the opening 230 such that the metal block 40 and the metal pillar become a conductive pillar 23, that is, a conductive pillar 23 is formed in two openings 410, 230.

Figures 1, 2B:
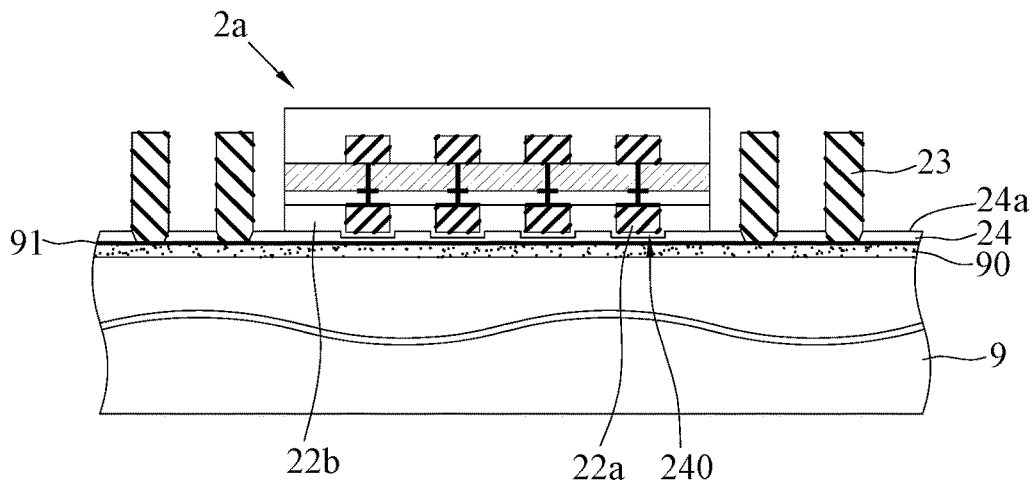
Figures 2, 2B:
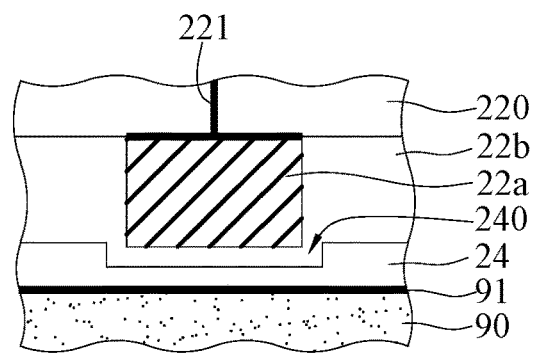
Figures 2, 2B, 3:
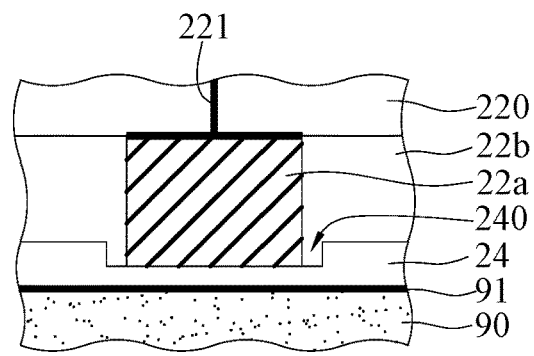

Please refer to FIGS. 2A-1 and 2B-1 together. The present disclosure provides an electronic structure 2a including an electronic body 21, a circuit portion 22, a plurality of first conductors 21a formed on the electronic body 21 and a plurality of second conductors 22a formed on the circuit portion 22 and electrically connected to the circuit portion 22. Subsequently, a first protection layer 21b is formed on the electronic body 21 such that the first protection layer 21b covers the first conductors 21a. Additionally, a second protection layer 22b is formed on the circuit portion 22 such that the second protection layer 22b covers the second conductors 22a. After that, the second protection layer 22b on the electronic structure 2a is bonded onto the first side 24a of the dielectric layer 24. Besides, each of the second conductors 22a is correspondingly accommodated in each of the grooves 240, and at the same time, the second protection layer 22b and the second conductors 22a are filled into the grooves 240 to cover the second conductors 22a.

In an embodiment, as shown in FIG. 2A-1, the electronic body 21 is a silicon substrate, such as a semiconductor chip, which has a plurality of conductive vias 210 (e.g., through-silicon vias [TSVs]) penetrating through the electronic body 21 to electrically connect the circuit portion 22 and the plurality of the first conductors 21a. For example, the circuit portion 22 includes at least one passivation layer 220 and conductive traces 221 bonded with the passivation layer 220 such that the conductive traces 221 electrically connect the conductive vias 210 and the plurality of second conductors 22a. It should be understood that there are many aspects of the component structure with conductive vias 210, and there is no particular limitation.

Moreover, as shown in FIG. 2A-1, the first conductors 21a and the second conductors 22a are metal pillars such as copper pillars. The first protection layer 21b is made of an insulating film or polyimide (PI), and the first conductors 21a are not exposed. The second protection layer 22b is made of a non-conductive film (NCF) or other materials that are easy to adhere to the dielectric layer 24, and the second conductors 22a are not exposed. For example, the second conductors 22a are first fabricated on the circuit portion 22 of the electronic structure 2a, and then the non-conductive film (i.e., the second protection layer 22b) is adhered to the second conductors 22a and the circuit portion 22. As a result, the non-conductive film presents a surface with different heights after being adhered, as shown in FIG. 2A-1. That is, the non-conductive film has a lower surface around the second conductor 22a. It should be understood that since the second conductors 22a of the electronic structure 2a adopt the configuration specifications of small pitch, low height and high density, it is not conducive to the capillary flow of the conventional underfill. Consequently, a non-conductive film is selected as the second protection layer 22b to replace the conventional dispensing (i.e., an underfill) process.

Further, the second conductors 22a are inserted into the grooves 240 such that the width dimension of each groove 240 of the dielectric layer 240 needs to be slightly greater than the width dimension of each second conductor 22a to compensate for process tolerances and to improve process yield. Therefore, the second protection layer 22b and the second conductors 22a are filled into the grooves 240 to cover the peripheral surface of the bottom section of the second conductors 22a. For example, the second protection layer 22b may be distributed between the bottom surface of the groove 240 and the end surface of the bottom section of the second conductor 22a, as shown in FIG. 2B-2. Alternatively, the second protection layer 22b may also be squeezed and free from being distributed between the bottom surface of the groove 240 and the end surface of the bottom section of the second conductor 22a, as shown in FIG. 2B-3, such that the end surface of the bottom section of the second conductor 22a contacts the dielectric material on the bottom surface of the groove 240.

In addition, since the second protection layer 22b has high and low surfaces, voids will be generated when it is attached onto the dielectric layer 24. Accordingly, as shown in FIG. 2A-1, by the grooves 240 corresponding to the high and low surfaces of the second conductors 22b, the uneven surface (or tooth-like surface) of the dielectric layer 24 and the high and low surfaces of the second conductors 22b are complementary to avoid undesirable problems caused by the voids. For example, problems such as poor reliability, structural fracture of the second conductors 22a, popcorn, or other problems can be avoided.

Figure 2C:
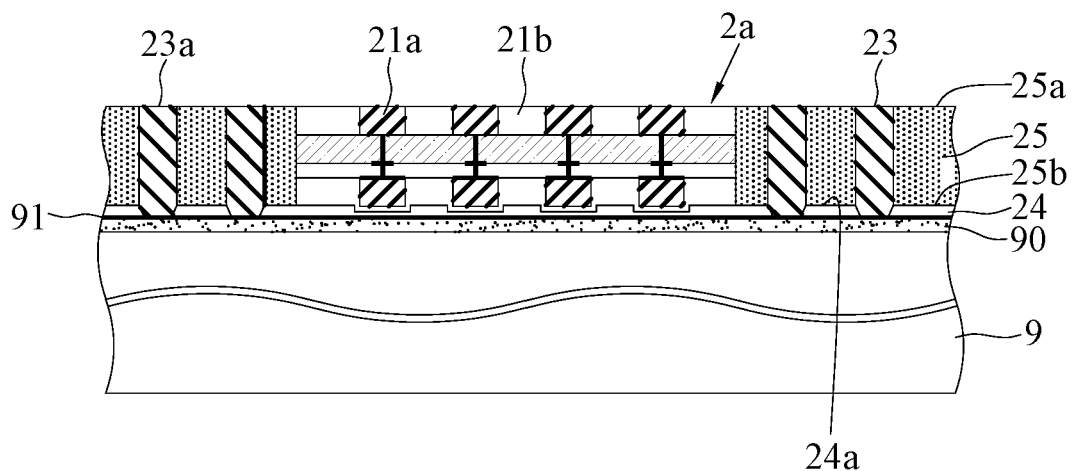

As shown in FIG. 2C, an encapsulation layer 25 is formed on the first side 24a of the dielectric layer 24 such that the encapsulation layer 25 covers the electronic structure 2a and the conductive pillars 23. The encapsulation layer 25 has a first surface 25a and a second surface 25b opposite to each other. In addition, the first protection layer 21b, the end surfaces of the first conductors 21a and the end surfaces 23a of the conductive pillars 23 are exposed from the first surface 25a of the encapsulation layer 25, and the second surface 25b of the encapsulation layer 25 is bonded onto the first side 24a of the dielectric layer 24.

In an embodiment, the encapsulation layer 25 is an insulating material, such as polyimide (PI), a dry film, an encapsulant, (e.g., epoxy resin) or molding compound. For example, the encapsulation layer 25 can be formed on the dielectric layer 24 by means of liquid compound, injection, lamination, or compression molding.

Furthermore, the first surface 25a of the encapsulation layer 25 can be flush with the first protection layer 21b, the end surfaces 23a of the conductive pillars 23 and the end surfaces of the first conductors 21a by a leveling process such that the end surfaces 23a of the conductive pillars 23 and the end surfaces of the first conductors 21a are exposed from the first surface 25a of the encapsulation layer 25. For example, the leveling process is to remove part of the material of the first protection layer 21b, part of the material of the conductive pillars 23, part of the material of the first conductors 21a and part of the material of the encapsulation layer 25 by grinding.

Figure 2D:
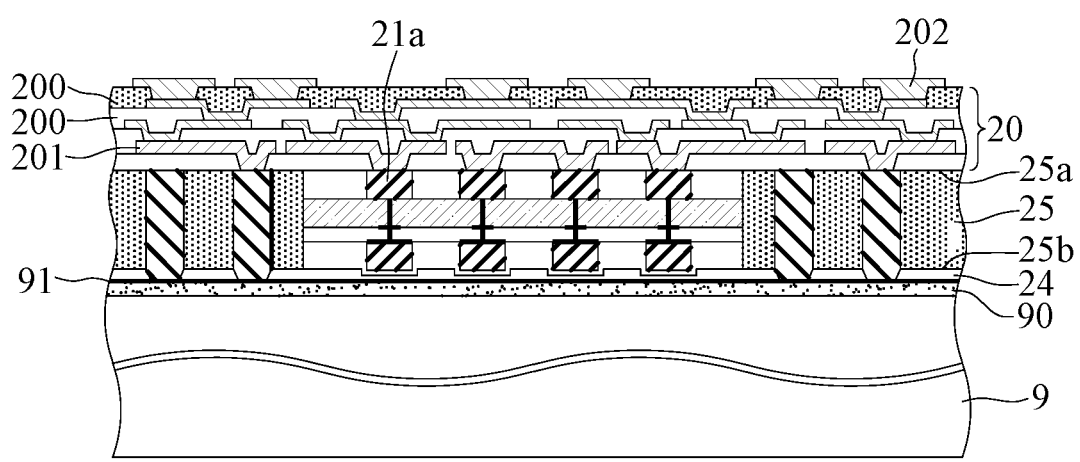

As shown in FIG. 2D, a circuit structure 20 is formed on the first surface 25a of the encapsulation layer 25 such that the circuit structure 20 electrically connects the conductive pillars 23 and the first conductors 21a.

In an embodiment, the circuit structure 20 includes at least one insulating layer 200 and at least one redistribution layer (RDL) 201 disposed on the insulating layer 200. The outmost insulating layer 200 can be used as a solder-proof layer, and the outmost RDL 201 is exposed from the solder-proof layer to serve as an electrical contact pad 202, such as a micro pad (commonly known as µ-pad).

Furthermore, the material forming the RDL 201 is copper, and the material forming the insulating layer 200 is a dielectric material such as polybenzoxazole (PBO), polyimide (PI) and prepreg (PP) or the like, or a solder-proof material such as solder mask or graphite.

Figure 2E:
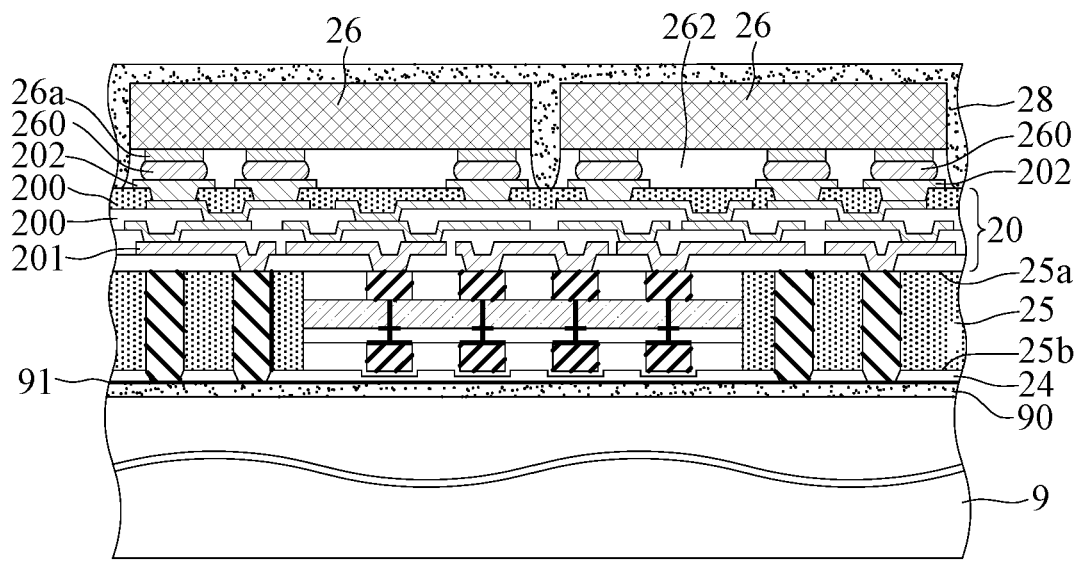

As shown in FIG. 2E, a plurality of electronic components 26 are disposed on the circuit structure 20, and then an encapsulant 28 is used to encapsulate the electronic components 26.

In an embodiment, the electronic component 26 is an active component, a passive component, or a combination thereof. The active component is, for example, a semiconductor chip, and the passive component is, for example, a resistor, a capacitor and an inductor. In an aspect, the electronic component 26 is, for example, a semiconductor chip, such as a graphics processing unit (GPU), high bandwidth memory (HBM), etc., and not limited thereto. In addition, the electronic structure 2a is used as a bridge die, which is electrically connected to the circuit structure 20 via the first conductors 21a, and electrically bridges at least two electronic components 26.

Moreover, the electronic component 26 has a plurality of conductive bumps 26a (e.g., copper pillars) which is electrically connected to the electrical contact pad 202 via a solder material 260. Additionally, the encapsulant 28 may simultaneously encapsulate the electronic components 26 and the conductive bumps 26a. In an embodiment, an under bump metallurgy (UBM) (not shown) can be formed on the electrical contact pad 202 to facilitate the bonding of the conductive bumps 26.

Further, the encapsulant 28 is an insulating material, such as polyimide (PI), a dry film, an encapsulant (e.g., epoxy resin) or molding compound, and can be formed on the circuit structure 20 by lamination or molding. It should be understood that the material forming the encapsulant 28 may be the same or different from the material of the encapsulation layer 25.

In addition, an underfill 262 may be first formed between the electronic component 26 and the circuit structure 20 to cover the conductive bumps 26a, and then the encapsulant 28 may be formed to cover the underfill 262 and the electronic component 26.

Figure 2F:
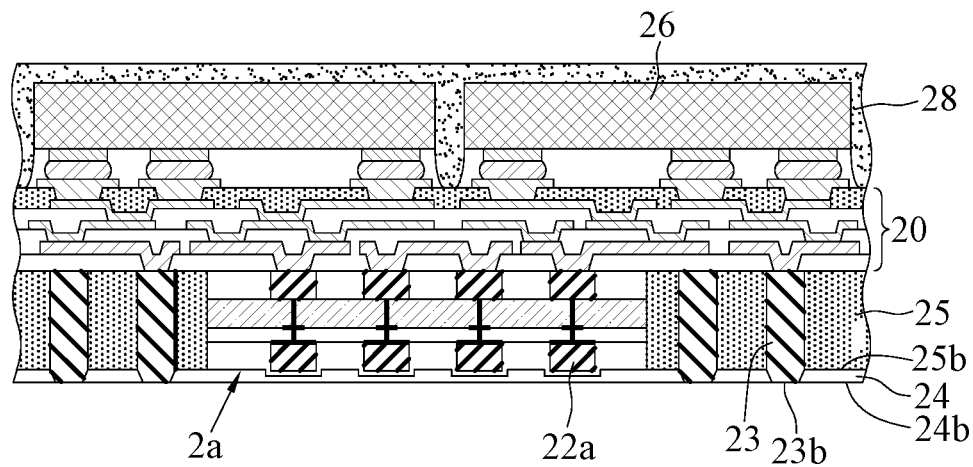

As shown in FIG. 2F, the carrier 9 and the sacrificial release layer 90 thereon are removed, and the metal layer 91 is subsequently removed to expose the second side 24b of the dielectric layer 24 and another end surfaces 23b of the conductive pillars 23.

In an embodiment, when peeling off the sacrificial release layer 90, the metal layer 91 serves as a barrier to avoid damaging the dielectric layer 24. Besides, after removing the carrier 9 and the sacrificial release layer 90 thereon, the metal layer 91 is removed by etching. At this time, the conductive pillars 23 are exposed from the second side 24b of the dielectric layer 24, and the second conductors 22a are free from being exposed from the second side 24b of the dielectric layer 24.

As such, by the design that the grooves 240 are free from penetrating through the dielectric layer 24, after the metal layer 91 is removed, the dielectric layer 24 still covers the bottom sections of the second conductors 22a, and the second conductors 22a will be free from being exposed from the external environment (or air). As a result, such design can prevent the second conductors 22a from oxidizing, resulting in surface oxides, thereby effectively avoiding affecting the yield of the subsequent circuit process, or avoiding the problem of poor electrical performance such as falling of the external solder balls (C4 specification).

Figures 1, 2G:
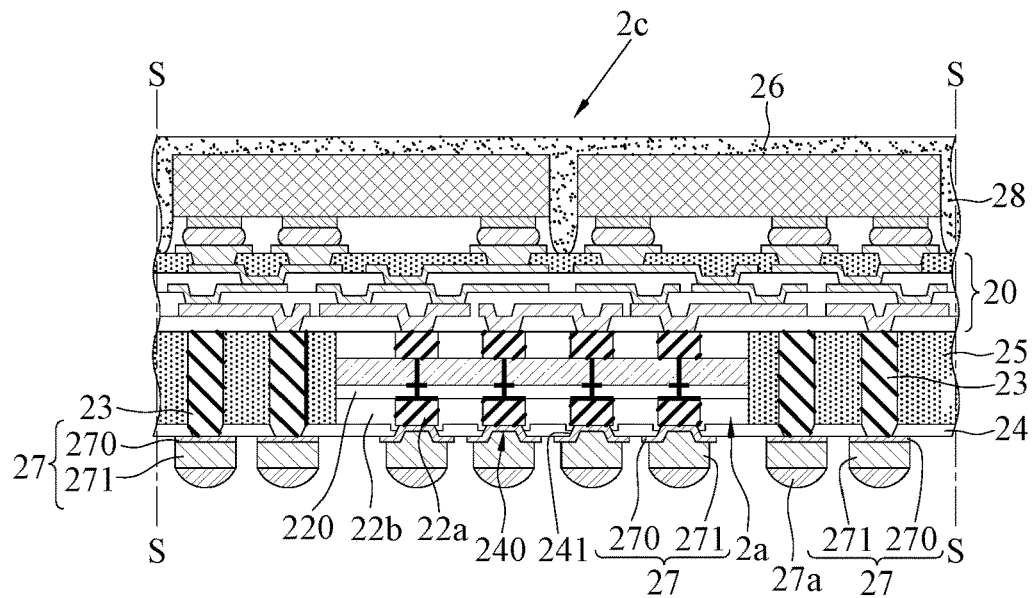
Figures 2, 2G:
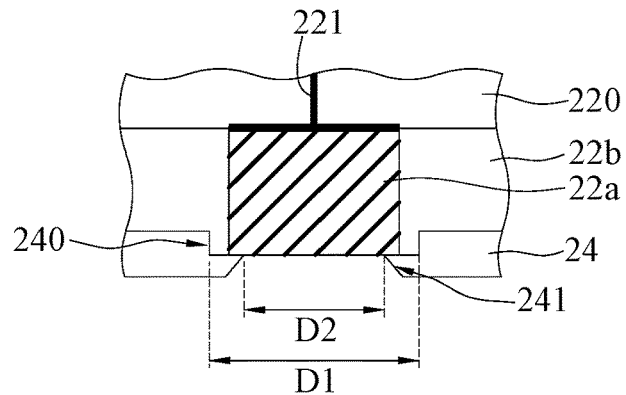
Figures 2, 2G, 3:
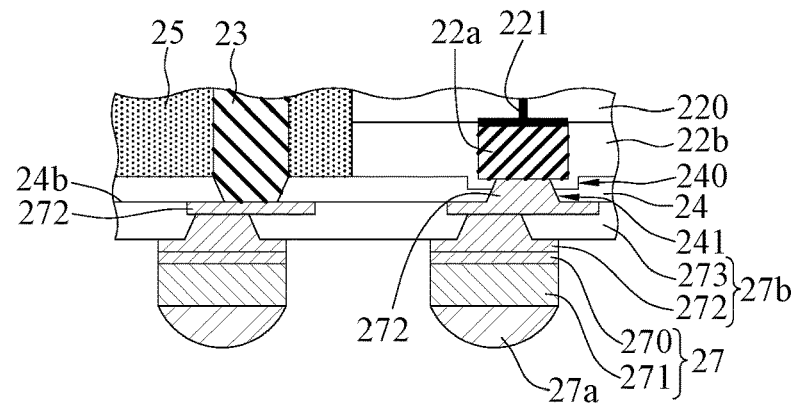

As shown in FIG. 2G-1, a plurality of conductive components 27 are formed on the second side 24b of the dielectric layer 24 such that a package module 2c is formed. In addition, the conductive components 27 are electrically connected to the conductive pillars 23 and the second conductors 22a.

In an embodiment, an opening process is performed on the second side 24b of the dielectric layer 24 to expose the second conductors 22 from the second side 24b of the dielectric layer 24, thereby bonding the second conductors 22a to the conductive components 27. For example, a plurality of holes 241 communicating with the grooves 240 are formed on the second side 24b of the dielectric layer 24 by a laser method such that the second conductors 22a are exposed from the dielectric layer 24, and the conductive components 27 are formed in the holes 241 to electrically connect the second conductors 22a. Additionally, each conductive component 27 includes a metal body (e.g., UBM) 270 and a copper pillar 271 bonded with the metal body 270, and a solder material 27a (e.g., solder bumps or solder balls) is formed on the end surface of the copper pillar 271. Besides, one aspect of the metal body 270 may be formed in the hole 241 to contact the second conductor 22a. Alternatively, another aspect of the metal body 270 is a pad formed on the second side 24b to contact the conductive pillar 23.

Moreover, if the process shown in FIG. 2B-2 is continued, after the hole 241 is formed, a laser can continue to burn and remove the second protection layer 22b on the end surface of the bottom section of the second conductor 22a such that the end surface of the bottom section of the second conductor 22a is exposed from the hole 241. As shown in FIG. 2G-1, the non-conductive film corresponding to the center of the end surface of the bottom section of the second conductor 22a will be removed such that the center of the bottom surface of the second conductor 22a is exposed for external connection of the conductive component 27, but the non-conductive film around the end surface of the bottom section of the second conductor 22a is still retained. It should be understood that if the process shown in FIG. 2B-3 is continued, after the hole 241 is formed, the end surface of the bottom section of the second conductor 22a will be directly exposed from the hole 241, as shown in FIG. 2G-2.

Furthermore, as shown in FIG. 2G-2, the width D1 of the groove 240 is greater than the width D2 of the hole 241. Hence, if the process shown in FIG. 2B-3 is continued, the second conductor 22a abuts against the bottom surface of the groove 240.

It should be understood that when the number of input/output (I/O) pins of the package module 2c is insufficient (for example, the number of conductive components 27 cannot meet the product requirements), the RDL process can still be used to perform build-up layers operation. As shown in FIG. 2G-3, a wiring structure 27b electrically connecting the second conductor 22a and the conductive component 27 is formed on the second side 24b of the dielectric layer 24 such that the wiring structure 27b is disposed between the dielectric layer 24 and the conductive component 27. Additionally, the wiring structure 27b may include at least one build-up circuit layer 272 corresponding to the hole 241 to reconfigure the number of I/O pins and their positions. It is even possible to form at least one build-up dielectric layer 273 on the dielectric layer 24 as required such that more build-up circuit layers 272 are disposed on the build-up dielectric layer 273, and the outermost build-up circuit layer 272 is bonded to the conductive component 27.

In addition, part of the material of the encapsulant 28 can be removed by a leveling process, such as grinding such that the upper surface of the encapsulant 28 is flush with the upper surface of the electronic component 26, and the electronic component 26 is exposed from the encapsulant 28.

Figure 2H:
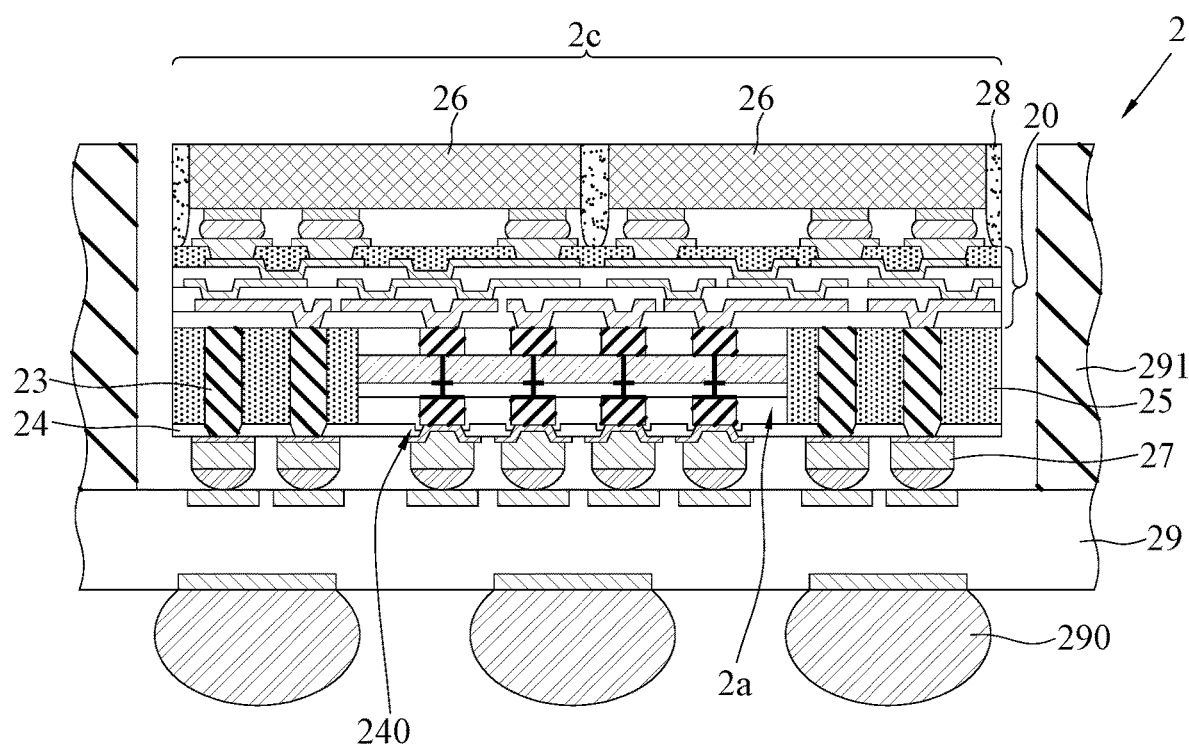

As shown in FIG. 2H, a singulation process is performed along a cutting path S shown in FIG. 2G-1 to obtain a plurality of package modules 2c, and then the package module 2c is disposed on a package substrate 29 via the conductive components 27.

In an embodiment, the underside of the package substrate 29 is subjected to a ball placement process to form a plurality of conductive components 290 (e.g., solder balls) such that an electronic package 2 is formed. In the subsequent manufacturing process, the electronic package 2 can be disposed on a circuit board (not shown) via the conductive components 290 on the lower side of the package substrate 29.

Moreover, a stiffener 291 (e.g., a metal frame) can be disposed on the package substrate 29 as required to eliminate the problem of stress concentration and avoid the warpage of the electronic package 2.

As a result, the method for manufacturing an electronic package according to the present disclosure uses the electronic structure 2a as a bridge die to directly electrically conduct at least two upper active chips (i.e., the electronic components 26) such that the electrical path is shortened, and the pitch between I/O pins or between electrical contact pads 202 can be effectively reduced as required. Besides, the number of layers of the RDLs 201 for electrical connection between upper and lower layers of the circuit structure 20 can also be reduced to increase the process yield.

Moreover, the electronic structure 2a has conductive vias 210 such that part of electrical paths (e.g., power source) can be directly transmitted up and down via the electronic structure 2a to the desired components (e.g., the package substrate 29 or the electronic components 26). Consequently, the electrical paths can be shortened, and the electrical performance can be improved.

Further, the grooves 240 formed by the dielectric layer 24 can correspond to the high and low surfaces of the second protection layer 22b of the electronic structure 2a such that the electronic structure 2a is free from generating voids after the dielectric layer 24 is adhered thereto, thereby avoiding the problem of poor manufacturing process (such as poor reliability, fracture of the second conductor 22a due to fragile interface, popcorn, etc.).

Furthermore, by accommodating the second conductors 22a of the electronic structure 2a by the grooves 240, it is advantageous to locate the electronic structure 2a such that the electronic structure 2a will be free from being deviated. Hence, the conductive components 27 and/or RDL 201 of the circuit structure 20 can be effectively connected to the second conductors 22a and/or the first conductors 21a of the electronic structure 2a to ensure the manufacturing process yield.

FIGS. 3A, 3B-1 and 3C-1 are schematic cross-sectional views illustrating a method for manufacturing an electronic package 3 in accordance with a second embodiment of the present disclosure. The difference between this embodiment and the first embodiment lies in the design of grooves 340, and the other manufacturing processes are substantially the same. Therefore, similarities between the two will not be repeated.

Figure 3A:
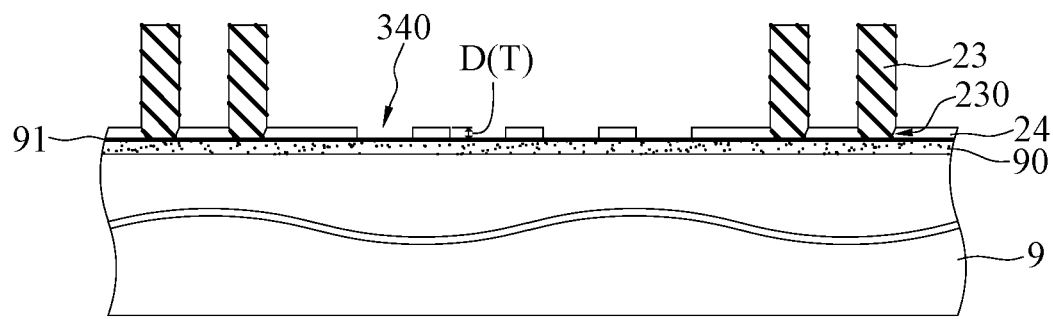

As shown in FIG. 3A, the groove 340 has a depth D that is equal to a thickness T of the dielectric layer 24, that is, when the ratio of the two is 1, the groove 340 is formed in and penetrated through the dielectric layer 24 to expose the metal layer 91 from the groove 340.

In an embodiment, the penetration type of the grooves 340 allows the grooves 340 and openings 230 to be fabricated at the same time, that is, the grooves 340 and the openings 230 are formed by one-time development and etching.

Figures 1, 3B:
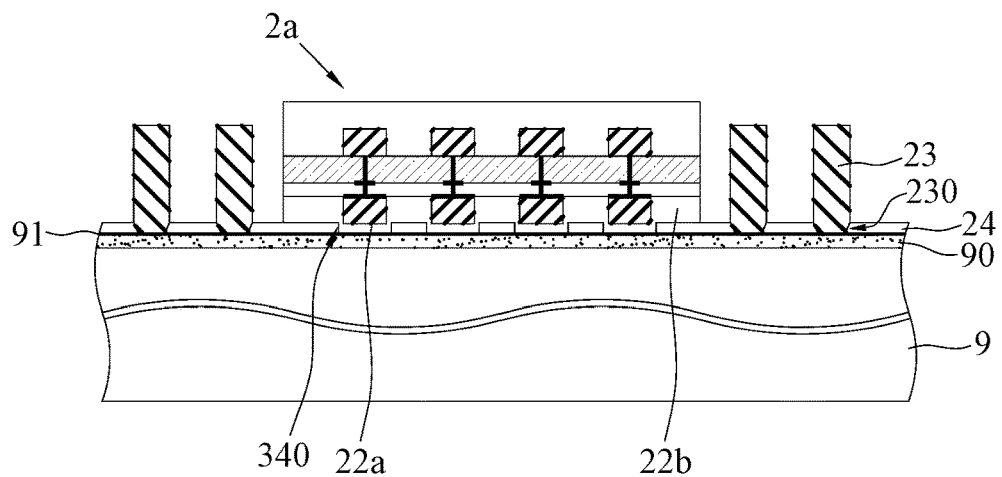
Figures 2, 3B:
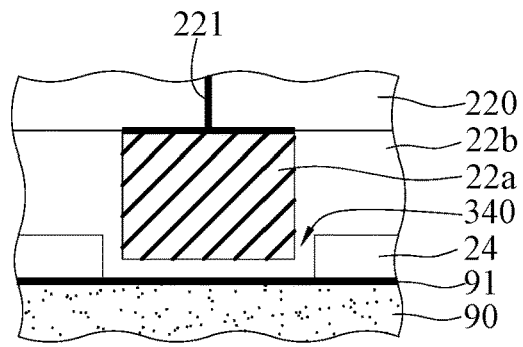
Figures 3, 3B:
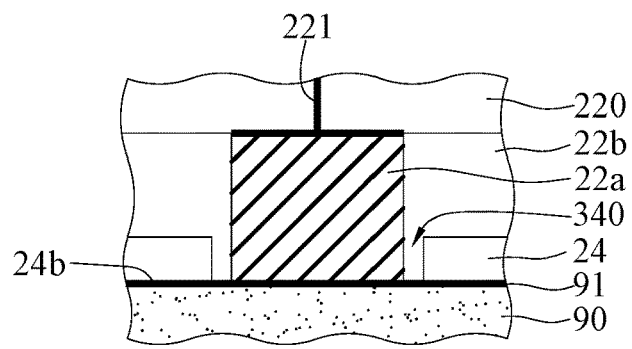

As shown in FIG. 3B-1, the electronic structure 2a is disposed on the dielectric layer 24 of the carrier 9, and each of the second conductors 22a of the electronic structure 2a is correspondingly accommodated in each of the grooves 340.

In an embodiment, each of the second conductors 22a is inserted into each of the grooves 340 such that the second protection layer 22b is also filled into the grooves 340 to cover the peripheral surface of the bottom section of each of the second conductors 22a. For example, the second protection layer 22b may be distributed between the metal layer 91 and the end surface of the bottom section of the second conductor 22a, as shown in FIG. 3B-2. Alternatively, the second protection layer 22b may also be squeezed and free from being distributed between the bottom surface of the groove 340 and the end surface of the bottom section of the second conductor 22a, as shown in FIG. 3B-3, such that the bottom surface (i.e., the end surface of the bottom section) of the second conductor 22a is flush with the second side 24b of the dielectric layer 24 so as to enable the end surface of the bottom section of the second conductor 22a to contact the metal layer 91.

Figures 1, 3C:
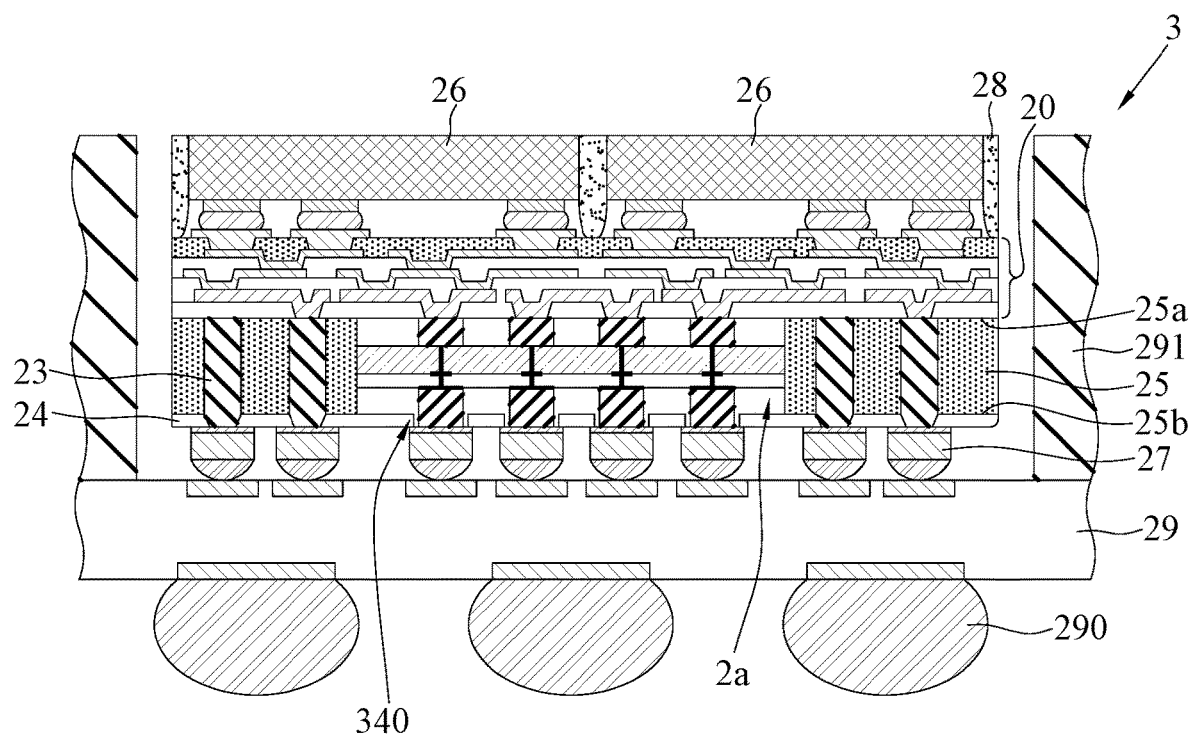
Figures 2, 3C:
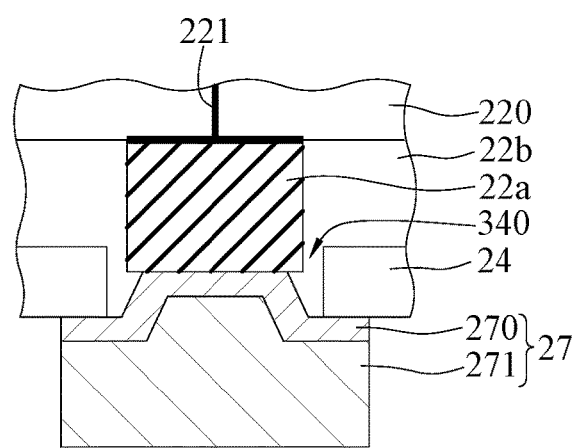

As shown in FIG. 3C-1, the packaging process shown in FIGS. 2C to 2H is performed to obtain a plurality of electronic packages 3.

In an embodiment, if the process shown in FIG. 3B-2 is continued, after the metal layer 91 is removed by etching, the second protection layer 22b on the end surface of the bottom section of the second conductor 22a can be burned and removed by a laser manner. As shown in FIG. 3C-2, a non-conductive film corresponding to the center of the end surface of the bottom section of the second conductor 22a will be removed such that the center of the end surface of the bottom section of the second conductor 22a is exposed for connection of the conductive component 27, but the non-conductive film around the end surface of the bottom section of the second conductor 22a is still retained. It should be understood that if the process shown in FIG. 3B-3 is continued, after the metal layer 91 is removed by etching, the end surface of the bottom section of the second conductor 22a will be exposed from the dielectric layer 24. As a result, compared with the first embodiment, the laser drilling operation can be omitted in this embodiment.

Moreover, since the groove 340 in this embodiment penetrates through the dielectric layer 24, after the metal layer 91 is removed, the end surface of the bottom section of the second conductor 22a may be flush with the surface of the second side 24b of the dielectric layer 24. In addition, since the end surface of the bottom section of the second conductor 22a is exposed, there may be reliability issues such as subsequent process yield or falling of solder balls caused by oxidation of the metal surface. Consequently, the reliability of the first embodiment may be better than the reliability of the second embodiment.

Therefore, the method for manufacturing an electronic package according to the present disclosure uses the electronic structure 2a as a bridge die to directly electrically conduct at least two active chips (i.e., the electronic components 26) such that the electrical path is shortened, and the pitch between I/O pins or between electrical contact pads 202 can be effectively reduced as required. In other words, the number of layers of the RDLs 201 for electrical connection between upper and lower layers of the circuit structure 20 can also be reduced to increase the process yield.

Moreover, the electronic structure 2a has conductive vias 210 such that part of electrical paths (e.g., power source) can be directly transmitted up and down via the electronic structure 2a to the desired components (e.g., the package substrate 29 or the electronic components 26). Accordingly, the electrical paths can be shortened, and the electrical performance can be improved.

Furthermore, the grooves 340 formed by the dielectric layer 24 can correspond to the high and low surfaces of the second protection layer 22b of the electronic structure 2a such that the electrical structure 2a is free from generating voids after the dielectric layer 24 adhered thereto, thereby avoiding the problem of poor manufacturing process.

Additionally, by accommodating the second conductors 22a of the electronic structure 2a by the grooves 340, it is advantageous to locate the electronic structure 2a such that the electronic structure 2a will be free from being deviated. Therefore, the conductive components 27 and/or RDL 201 of the circuit structure 20 can be effectively connected to the second conductors 22a and/or the first conductors 21a of the electronic structure 2a to ensure the manufacturing process yield.

The present disclosure further provides an electronic package 2, 3, which includes: an electronic structure 2a having a plurality of second conductors 22a, a second protection layer 22b, a dielectric layer 24 and a plurality of conductive components 27.

The second protection layer 22b is formed on the electronic structure 2a to cover the plurality of second conductors 22a.

The dielectric layer 24 has a first side 24a and a second side 24b opposite to each other. In addition, there are a plurality of grooves 240, 340 on the first side 24a such that the electronic structure 2a is bonded to the first side 24a of the dielectric layer 24 with the second protection layer 22b thereon, the second protection layer 22b is disposed in the grooves 240, 340, and each of the second conductors 22a is correspondingly accommodated in each of the grooves 240, 340.

The conductive components 27 is disposed on the second side 24b of the dielectric layer 24 and electrically connected to the second conductors 22a.

In an embodiment, the grooves 240 are free from penetrating through the dielectric layer 24. For example, at least one hole 241 communicating with the groove 240 is formed on the second side 24b of the dielectric layer 24 such that the second conductor 22a is exposed from the hole 241, and the conductive component 27 is further formed in the hole 241 to be electrically connected to the second conductor 22a.

In an embodiment, the groove 240 has a width D1 that is greater than a width D2 of the hole 241.

In an embodiment, the second protection layer 22b is a non-conductive film.

In an embodiment, the second protection layer 22b is further formed between the second conductor 22a and a bottom surface of the grooves 240, 340.

In an embodiment, the groove 340 penetrates through the dielectric layer 24.

In an embodiment, the second conductor 22a has a bottom surface that is flush with a surface of the second side 24b of the dielectric layer 24.

In an embodiment, the electronic package 2, 3 further includes a wiring structure 27b disposed on the second side 24b of the dielectric layer 24 and electrically connecting the second conductor 22a and the conductive component 27 such that the wiring structure 27b is disposed between the dielectric layer 24 and the conductive component 27.

In an embodiment, the electronic package 2, 3 further includes an encapsulation layer 25 covering the electronic structure 2a. The electronic package 2, 3 also includes a circuit structure 20 formed on the encapsulation layer 25 and electrically connected to the electronic structure 2a, and at least two electronic components 26 disposed on the circuit structure 20 and electrically connected to the circuit structure 20. Furthermore, the electronic structure 2a is a bridging component electrically connected to the at least two electronic components 26, and a plurality of conductive vias 210 electrically connecting the second conductors 22a and the circuit structure 20 are disposed inside the electronic structure 2a such that the conductive vias 210 are electrically connected to the circuit structure 20 and the electronic components 26. Alternatively, the electronic package 2, 3 further includes a plurality of conductive pillars 23 disposed on the side of the dielectric layer 24 as with the electronic structure 2a, and the plurality of conductive pillars 23 are electrically connected to the conductive components 27 and the circuit structure 20.

In summary, according to the electronic package and method for manufacturing the same of the present disclosure, the design of the grooves in the dielectric layer is used to correspond to the high and low surfaces of the second protection layer of the electronic structure such that voids are free from being generated after the electronic structure is bonded to the dielectric layer, thereby avoiding the problem of poor manufacturing process.

Additionally, by accommodating the second conductors of the electronic structure by the grooves, it is advantageous to locate the electronic structure such that the electronic structure will be free from being deviated. As such, the conductive components or the redistribution layer of the circuit structure can be effectively connected to the second conductors or the first conductors so as to ensure the manufacturing process yield.

The above embodiments are set forth to illustrate the principles of the present disclosure, and should not be interpreted as to limit the present disclosure in any way. The above embodiments can be modified by one of ordinary skill in the art without departing from the scope of the present disclosure as defined in the appended claims.

What is claimed is:

1. An electronic package, comprising:
an electronic structure having a plurality of conductors;
a protection layer formed between the plurality of conductors of the electronic structure to continuously cover the plurality of conductors;
a dielectric layer having a plurality of grooves to enable the electronic structure to be bonded onto one side of the dielectric layer with the protection layer thereon, wherein the plurality of grooves penetrate through the dielectric layer, the protection layer is simultaneously disposed in the plurality of grooves and between the plurality of conductors, and each of the plurality of conductors is correspondingly accommodated in each of the plurality of grooves; and
a plurality of conductive components disposed on another side of the dielectric layer and electrically connected to the plurality of conductors.

2. The electronic package of claim 1, further comprising a plurality of holes formed on the another side of the dielectric layer and communicating with the plurality of grooves, wherein the plurality of conductors are exposed from the plurality of holes, respectively, and the plurality of conductive components are further formed in the plurality of holes, respectively, to electrically connect with the plurality of conductors.

3. The electronic package of claim 2, wherein each of the plurality of grooves has a width greater than a width of each of the plurality of holes.

4. The electronic package of claim 1, wherein the protection layer is a non-conductive film.

5. The electronic package of claim 1, wherein the protection layer is further formed between the plurality of conductors and a bottom surface of the plurality of grooves.

6. The electronic package of claim 1, wherein the plurality of conductors have a bottom surface flush with the another side of the dielectric layer.

7. The electronic package of claim 1, further comprising a wiring structure disposed on the another side of the dielectric layer and electrically connected to the plurality of conductors and the plurality of conductive components, wherein the wiring structure is disposed between the dielectric layer and the plurality of conductive components.

8. The electronic package of claim 1, further comprising an encapsulation layer covering the electronic structure.

9. The electronic package of claim 8, further comprising a circuit structure formed on the encapsulation layer and electrically connected to the electronic structure, and at least two electronic components disposed on the circuit structure and electrically connected to the circuit structure.

10. The electronic package of claim 9, wherein the electronic structure is a bridging component electrically connected to the at least two electronic components, and a plurality of conductive vias electrically connected to the plurality of conductors and the circuit structure are disposed in the electronic structure, such that the plurality of conductive vias are electrically connected to the circuit structure and the electronic components.

11. The electronic package of claim 9, further comprising a plurality of conductive pillars disposed on the side of the dielectric layer as with the electronic structure, wherein the plurality of conductive pillars are electrically connected to the plurality of conductive components and the circuit structure.

12. A method for manufacturing an electronic package, comprising:
providing an electronic structure including a plurality of conductors;
forming a protection layer between the plurality of conductors of the electronic structure to continuously cover the plurality of conductors;
providing a dielectric layer on a carrier, wherein the dielectric layer has a plurality of grooves, and the plurality of grooves penetrate through the dielectric layer;
bonding the protection layer of the electronic structure onto one side of the dielectric layer, wherein the protection layer is simultaneously disposed in the plurality of grooves and between the plurality of conductors, and each of the plurality of conductors is correspondingly accommodated in each of the plurality of grooves;
removing the carrier, wherein the plurality of conductors are exposed from another side of the dielectric layer; and
disposing a plurality of conductive components on the another side of the dielectric layer, wherein the plurality of conductive components are electrically connected to the plurality of conductors.

13. The method of claim 12, wherein after the carrier is removed, a plurality of holes connected to the plurality of grooves are formed on the another side of the dielectric layer, such that the plurality of conductors are exposed from the plurality of holes.

14. The method of claim 13, wherein each of the plurality of grooves has a width greater than a width of each of the plurality of holes, such that each of the plurality of conductors abuts against a bottom surface of each of the plurality of grooves.

15. The method of claim 13, wherein the plurality of conductive components are further formed in the plurality of holes, respectively, to electrically connect with the plurality of conductors.

16. The method of claim 12, wherein the protection layer is a non-conductive film.

17. The method of claim 12, wherein the protection layer is further formed between the plurality of conductors and a bottom surface of the plurality of grooves.

18. The method of claim 12, wherein the plurality of conductors have a bottom surface flush with the another side of the dielectric layer.

19. The method of claim 12, further comprising disposing a wiring structure electrically connected to the plurality of conductors and the plurality of conductive components on the another side of the dielectric layer, wherein the wiring structure is disposed between the dielectric layer and the plurality of conductive components.

20. The method of claim 12, further comprising covering the electronic structure with an encapsulation layer.

21. The method of claim 20, further comprising forming a circuit structure electrically connected to the electronic structure on the encapsulation layer, and disposing at least two electronic components electrically connected onto the circuit structure.

22. The method of claim 21, wherein the electronic structure is a bridging component electrically connected to the at least two electronic components, and a plurality of conductive vias electrically connected to the plurality of conductors and the circuit structure are disposed in the electronic structure, such that the plurality of conductive vias are electrically connected to the electronic components and the plurality of conductive components.

23. The method of claim 21, further comprising disposing a plurality of conductive pillars on the side of the dielectric layer as with the electronic structure, wherein the plurality of conductive pillars are electrically connected to the plurality of conductive components and the circuit structure.

24. The method of claim 23, further comprising simultaneously forming the plurality of grooves and a plurality of openings on the dielectric layer by exposure and development to form the plurality of conductive pillars from the plurality of openings respectively.

25. The method of claim 23, further comprising forming a plurality of openings on the dielectric layer by exposure and development, and subsequently forming the plurality of grooves on the dielectric layer by exposure and development to form the plurality of conductive pillars from the plurality of openings respectively.

26. The method of claim 23, wherein a manufacturing process of the plurality of grooves comprises:
forming a first insulating material with an opening on the carrier;
forming a second insulating material on the first insulating material; and
forming a groove for exposing the first insulating material on the second insulating material and an another opening connecting with the opening, wherein the first insulating material and the second insulating material serve as the dielectric layer, and one of the conductive pillars is formed in the opening and the another opening.

* * * * *